(12) United States Patent
Zhuang et al.

(10) Patent No.: US 12,557,393 B2
(45) Date of Patent: Feb. 17, 2026

(54) METHOD OF SEMICONDUCTOR LAYOUT WITH DIFFERENT ROW HEIGHTS

(71) Applicant: TAIWAN SEMICONDUCTOR MANUFACTURING CO., LTD., Hsinchu (TW)

(72) Inventors: Hui-Zhong Zhuang, Kaohsiung (TW); Xiang-Dong Chen, San Diego, CA (US); Lee-Chung Lu, Taipei (TW); Tzu-Ying Lin, Hsinchu (TW); Yung-Chin Hou, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 483 days.

(21) Appl. No.: 17/884,293

(22) Filed: Aug. 9, 2022

(65) Prior Publication Data

US 2022/0384417 A1 Dec. 1, 2022

Related U.S. Application Data

(62) Division of application No. 16/855,882, filed on Apr. 22, 2020, now Pat. No. 11,682,665.

(60) Provisional application No. 62/863,656, filed on Jun. 19, 2019.

(51) Int. Cl.
| | |
|---|---|
| *H10D 89/10* | (2025.01) |
| *G06F 30/392* | (2020.01) |
| *H01L 23/528* | (2006.01) |
| *H10D 84/85* | (2025.01) |

(52) U.S. Cl.
CPC ........... *H10D 89/10* (2025.01); *G06F 30/392* (2020.01); *H01L 23/5286* (2013.01); *H10D 84/853* (2025.01)

(58) Field of Classification Search
None
See application file for complete search history.

(56) References Cited

U.S. PATENT DOCUMENTS

| | | | |
|---|---|---|---|
| 7,129,562 B1 * | 10/2006 | Gheewala | ........... H01L 27/0207 257/574 |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,502,351 B1 | 11/2016 | Sahu | |
| 9,520,482 B1 | 12/2016 | Chang et al. | |
| 9,548,303 B2 | 1/2017 | Lee et al. | |

(Continued)

FOREIGN PATENT DOCUMENTS

| | | |
|---|---|---|
| CN | 107919354 A | 4/2018 |
| KR | 20190062312 A | 6/2019 |

(Continued)

*Primary Examiner* — Nilufa Rahim
(74) *Attorney, Agent, or Firm* — Maschoff Brennan

(57) ABSTRACT

A method includes disposing a first power rail, a second power rail and a third power rail arranged in order; disposing a first cell row having a first row height between the first power rail and the second power rail; and disposing a second cell row having the first row height between the third power rail and the second power rail. Each of the first power rail and the third power rail has a first width, and the second power rail has a second width larger than the first width.

20 Claims, 9 Drawing Sheets

(56) References Cited

U.S. PATENT DOCUMENTS

| | | |
|---|---|---|
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2013/0026572 A1 | 1/2013 | Kawa et al. |
| 2013/0214433 A1 | 8/2013 | Penzes |
| 2014/0097493 A1 | 4/2014 | Baek et al. |
| 2014/0252477 A1 | 9/2014 | Tseng et al. |
| 2015/0301973 A1* | 10/2015 | Rim ................ H10D 89/10 710/305 |
| 2016/0055285 A1 | 2/2016 | Baek et al. |
| 2016/0342726 A1 | 11/2016 | Yuan |
| 2017/0200717 A1 | 7/2017 | Huang |
| 2018/0074117 A1 | 3/2018 | Salem et al. |
| 2018/0096092 A1 | 4/2018 | Kim et al. |
| 2018/0308933 A1 | 10/2018 | Tung |
| 2019/0164949 A1 | 5/2019 | Sio |
| 2019/0181130 A1 | 6/2019 | Do |
| 2019/0355749 A1 | 11/2019 | Do |
| 2020/0050728 A1* | 2/2020 | Kim ................ H10D 89/10 |
| 2020/0051977 A1* | 2/2020 | Lim ................ H10D 62/102 |
| 2020/0058681 A1 | 2/2020 | Lai |
| 2020/0251464 A1 | 8/2020 | Gadigatla |

FOREIGN PATENT DOCUMENTS

| | | |
|---|---|---|
| TW | 201436233 A | 9/2014 |
| TW | 201735352 A | 10/2017 |

\* cited by examiner

METHOD OF SEMICONDUCTOR LAYOUT WITH DIFFERENT ROW HEIGHTS

CROSS-REFERENCE TO RELATED APPLICATION

The present application is a divisional application of U.S. application Ser. No. 16/855,882, filed on Apr. 22, 2020, which claims priority to U.S. Provisional Application Ser. No. 62/863,656, filed Jun. 19, 2019, which is herein incorporated by reference.

BACKGROUND

With increasing down-scaling of integrated circuits and increasingly demanding requirements for higher speed of integrated circuits, transistors need to have higher drive currents with increasingly smaller dimensions. Fin field-effect transistors (finFETs) were thus developed, and are often utilized to implement transistors and other devices in an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
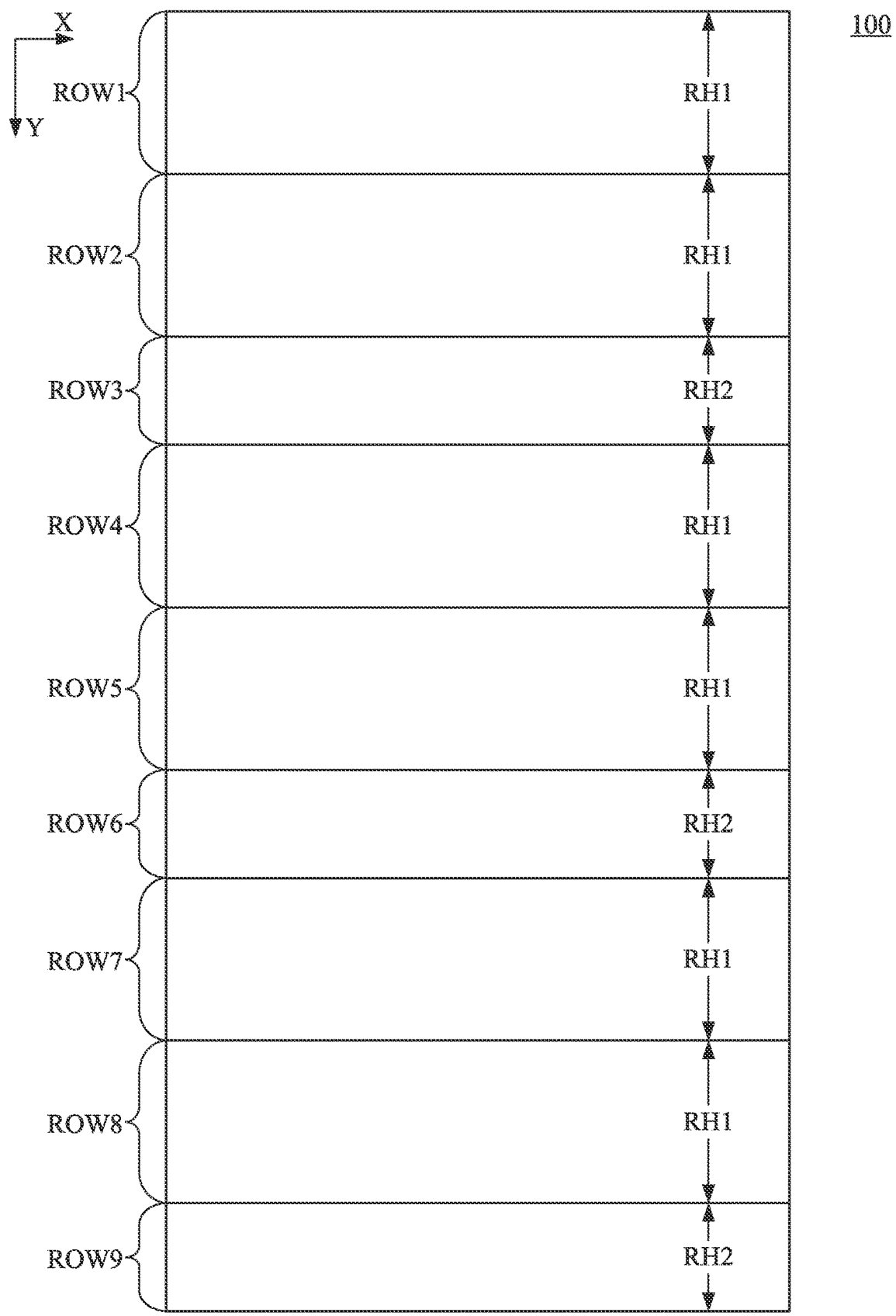
FIG. 1 is a top view diagram of a semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Semiconductor technologies with small feature sizes lead to more interactions between semiconductor fabrication and design. For example, when a transistor is manufactured, the manufacturing variations on the transistor may cause a shift of some critical performance indexes such as parasitic resistance, timing, noise and reliability. If the parasitic resistance of the transistor is shifted according to the manufacturing variations, an operating current flowing through the transistor will vary dramatically. Some embodiments in this disclosure include a source resistor connected between a source terminal of a transistor and a ground terminal, and the source resistor can be utilized to suppress or reduce a variation of the operating current induced by variations of the transistor.

FIG. 1 is a top view diagram of a semiconductor device in accordance with various embodiments of the present disclosure. As illustratively shown in FIG. 1, the semiconductor device 100 includes several cell rows ROW1~ROW9. In some embodiments, some integrated circuit cells (not shown in FIG. 1) can be arranged on these cell rows ROW1~ROW9. The number of the cell rows ROW1~ROW9 in the semiconductor device 100 in FIG. 1 is given for illustrative purposes. Various numbers of the cell rows ROW1~ROW9 are within the contemplated scope of the present disclosure.

As illustratively shown in FIG. 1, the cell row ROW1 extends in a direction along an X axis. The cell row ROW2 is disposed adjacent to and parallel with the cell row ROW1, and the cell row ROW2 extends in the direction along the X axis. The cell row ROW3 is disposed adjacent to and parallel with the cell row ROW2, and the cell row ROW3 also extends in the direction along the X axis. Similarly, the cell rows ROW4~ROW9 are disposed in parallel with the cell rows ROW1 and ROW2, and each of the cell rows ROW4~ROW9 extends in the direction along the X axis. As illustratively shown in FIG. 1, the cell rows ROW1~ROW9 are arranged along a Y axis, which is substantially perpendicular to the X axis.

In some embodiments, there are two groups of cell rows among the cell rows ROW1~ROW9 in reference with their row heights. As illustratively shown in FIG. 1, each of the cell rows ROW1, ROW2, ROW4, ROW5, ROW7 and ROW8 is configured to have a row height RH1, and each of the cell rows ROW3, ROW6 and ROW9 is configured to have another row height RH2, which is shorter than the row height RH1. As illustratively shown in FIG. 1, the cell rows ROW1, ROW2, ROW4, ROW5, ROW7 and ROW8 with the row height RH1 can be regarded as a first group "A" of the cell rows ROW1~ROW9, and the cell rows ROW3, ROW6 and ROW9 can be regarded as a second group "B" of the cell rows ROW1~ROW9.

In some embodiments, the cell rows in the first group "A" and the cell rows in the second group "B" are interlaced in a periodic sequence along the Y axis. As illustratively shown in FIG. 1, the cell rows ROW1~ROW9 are interlaced according to a sequential order of "AABAABAAB". In other words, the cell rows ROW1~ROW9 are interlaced in the periodic sequence of "AAB". As illustratively shown in FIG. 1, there are six cell rows ROW1, ROW2, ROW4, ROW5, ROW7 and ROW8 in the first group "A" and three cell rows ROW3, ROW6 and ROW9 in the second group "B". In other words, in the periodic sequence, a quantity of the cell rows in the first group "A" with the higher row height RH1 is greater than a quantity of the cell rows in the second group "B" with the shorter row height RH2.

Figure 2:
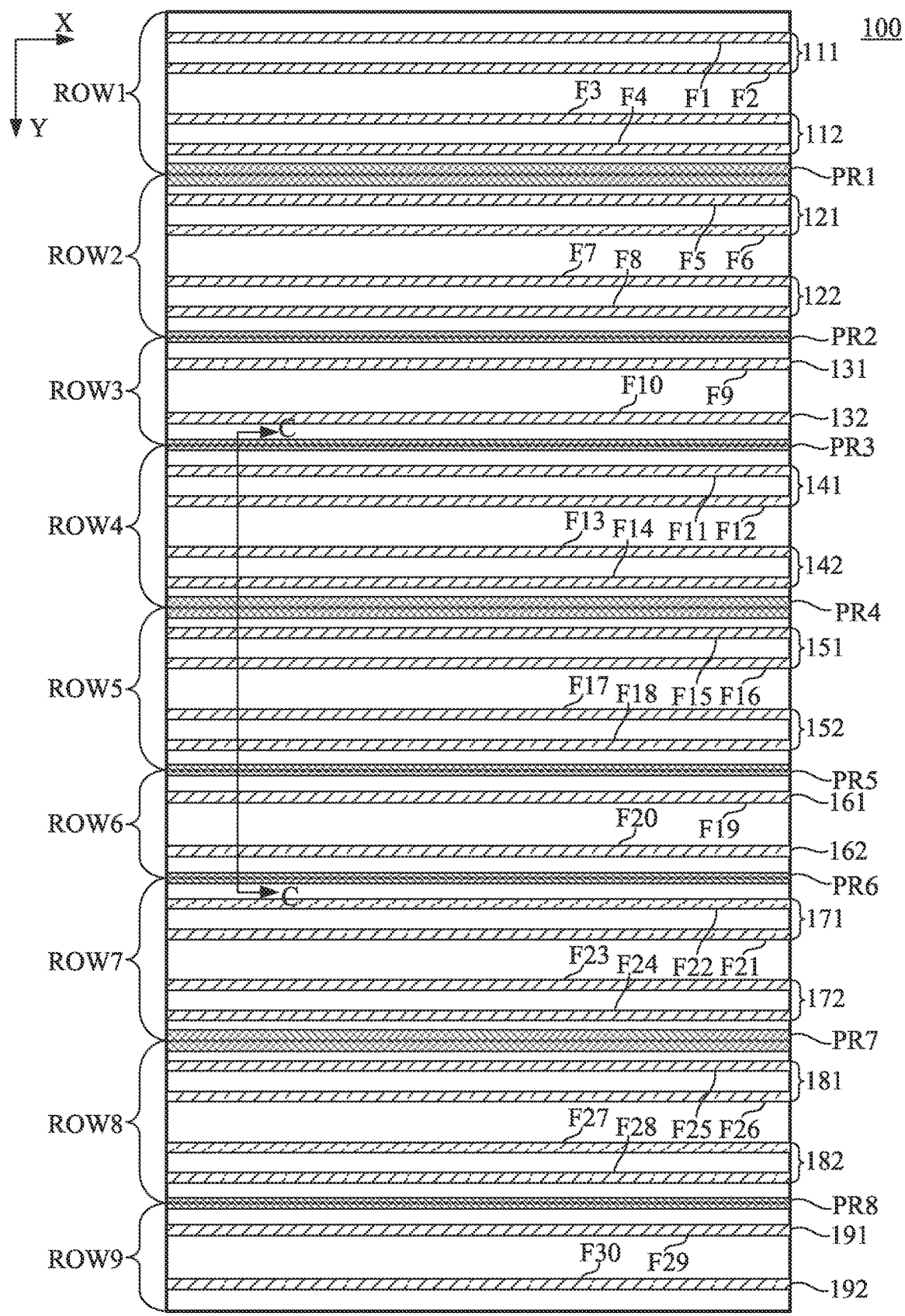
FIG. 2 is a top view diagram illustrating a structure of the semiconductor device in FIG. 1 in accordance with some embodiments.
Figure 3:
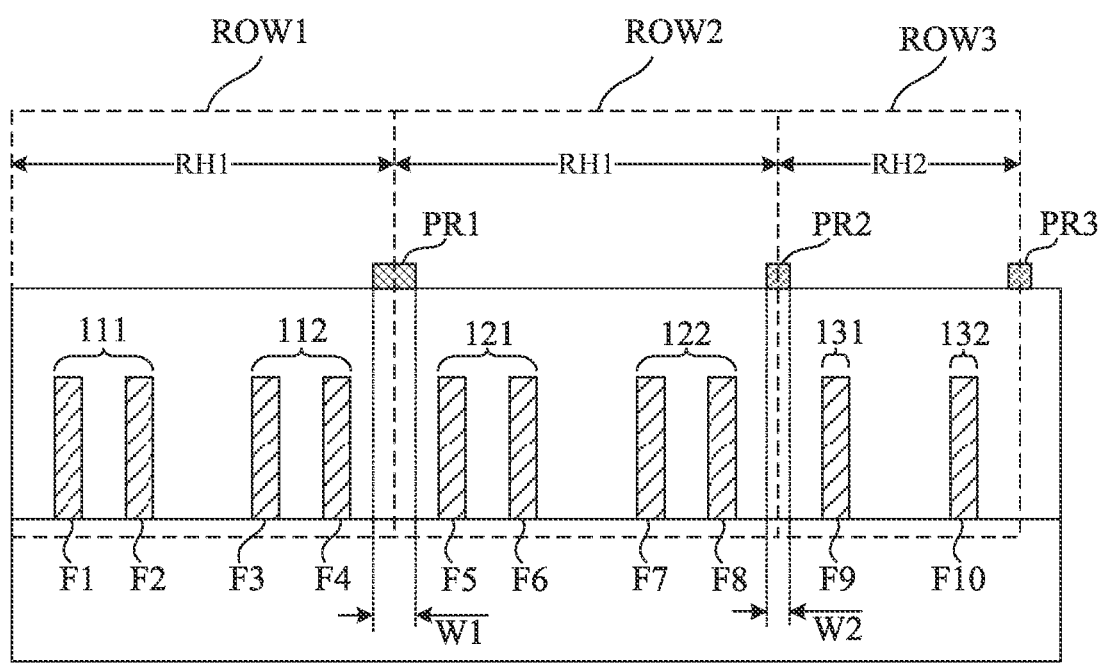
FIG. 3 is a sectional view diagram illustrating a structure of some cell rows along a sectional line in FIG. 2 in accordance with some embodiments.

FIG. 2 is a top view diagram illustrating a structure of the semiconductor device 100 in FIG. 1 in accordance with some embodiments. FIG. 3 is a sectional view diagram illustrating a structure of the cell rows ROW1~ROW3 along a sectional line C-C in FIG. 2 in accordance with some embodiments. With respect to the embodiments of FIG. 1, like elements in FIG. 2 and FIG. 3 are designated with the same reference numbers for ease of understanding.

As illustratively shown in FIG. 1, FIG. 2 and FIG. 3, the cell row ROW1 with the row height RH1 in the first group "A" includes two active regions 111 and 112. Each of the active regions 111 and 112 extend in the direction along the X axis. As illustrated in FIG. 1 and FIG. 2, the active region 111 of the cell row ROW1 includes two fin-shaped structures F1 and F2, and the active region 112 of the cell row ROW1 includes another two fin-shaped structures F3 and F4. In other words, each one of the active regions 111 and 112 include two fin-shaped structures, such as F1 and F2, or F3 and F4.

In some embodiments, the fin-shaped structures F1 and F2 are n-type fin-shaped structures, and the fin-shaped structures F3 and F4 are p-type fin-shaped structures. In some other embodiments, the fin-shaped structures F1 and F2 are p-type fin-shaped structures, and the fin-shaped structures F3 and F4 are n-type fin-shaped structures.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Similarly, as illustratively shown in FIG. 1, FIG. 2 and FIG. 3, the cell row ROW2 with the row height RH1 in the first group "A" includes two active regions 121 and 122. Each of the active regions 121 and 122 extend in the direction along the X axis. As illustrated in FIG. 1 and FIG. 2, the active region 121 of the cell row ROW2 includes two fin-shaped structures F5 and F6, and the active region 122 of the cell row ROW2 includes another two fin-shaped structures F7 and F8. In other words, each one of the active regions 121 and 122 include two fin-shaped structures, such as F5 and F6, or F7 and F8.

In some embodiments, the fin-shaped structures F5 and F6 are n-type fin-shaped structures, and the fin-shaped structures F7 and F8 are p-type fin-shaped structures. In some other embodiments, the fin-shaped structures F5 and F6 are p-type fin-shaped structures, and the fin-shaped structures F7 and F8 are n-type fin-shaped structures.

As illustratively shown in FIG. 1, FIG. 2 and FIG. 3, the cell row ROW3 with the row height RH2 in the second group "B" includes two active regions 131 and 132. Each of the active regions 131 and 132 extend in the direction along the X axis. As illustrated in FIG. 1 and FIG. 2, the active region 131 of the cell row ROW3 includes one fin-shaped structure F9, and the active region 132 of the cell row ROW3 includes another one fin-shaped structure F10. In other words, each one of the active regions 131 and 132 include one fin-shaped structure, such as F9, or F10.

In some embodiments, such an active region may include one or more fin-shaped structures of one or more three-dimensional field-effect-transistors (e.g., FinFETs, gate-all-around (GAA) transistors), or an oxide-definition (OD) region of one or more planar metal-oxide-semiconductor field-effect transistors (MOSFETs). The active region may serve as a source feature or a drain feature of the respective transistor (s).

In some embodiments, the active region 111 of the cell row ROW1 includes two fin-shaped structures F1 and F2 together as an active area to form an integrated circuit component (such as a transistor), such that an equivalent width of the active area of the integrated circuit component disposed on the active region 111 will be wider than one of another integrated circuit component disposed on the active region 131, which includes one fin-shaped structure F9. In other words, integrated circuit components disposed on the cell row ROW1 may have a better performance than integrated circuit components disposed on the cell row ROW3.

In some embodiments, the fin-shaped structure F9 is an n-type fin-shaped structure, and the fin-shaped structure F10 is a p-type fin-shaped structure. In some other embodiments, the fin-shaped structures F9 is a p-type fin-shaped structure, and the fin-shaped structures F10 is an n-type fin-shaped structure.

As illustratively shown in FIG. 1 and FIG. 2, the cell rows ROW4~ROW6 have structures similar to the cell rows ROW1~ROW3, and the cell rows ROW7~ROW9 also have structures similar to the cell rows ROW1~ROW3. The cell rows ROW4, ROW5, ROW7 and ROW8 with the row height RH1 in the first group "A" include two active regions (141 and 142, 151 and 152, 171 and 172, or 181 and 182), and each of the active regions includes two fin-shaped structures, such as the fin-shaped structures F11 and F12 in the active region 141, the fin-shaped structures F13 and F14 in the active region 142, the fin-shaped structures F15 and F16 in the active region 151, the fin-shaped structures F17 and F18 in the active region 152, the fin-shaped structures F21 and F22 in the active region 171, the fin-shaped structures F23 and F24 in the active region 172, the fin-shaped structures F25 and F26 in the active region 181, and the fin-shaped structures F27 and F28 in the active region 182.

The cell rows ROW6 and ROW9 with the row height RH2 in the second group "B" include two active regions (161 and 162, or 191 and 192), and each of the active regions includes one fin-shaped structure, such as the fin-shaped structure F19 in the active region 161, the fin-shaped structure F20 in the active region 162, the fin-shaped structure F29 in the active region 191, and the fin-shaped structure F30 in the active region 192.

Figure 4:
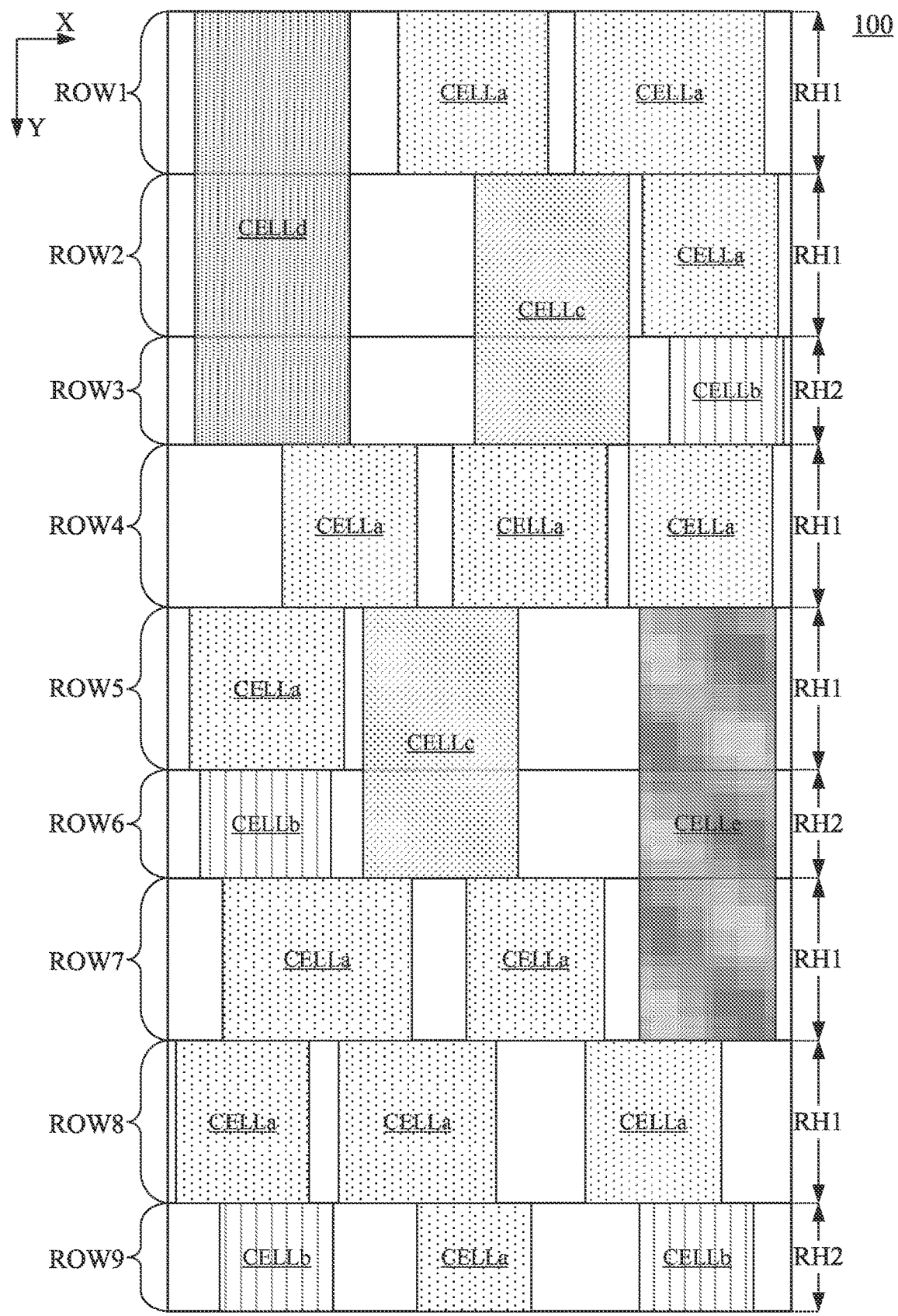
FIG. 4 is an exemplary layout diagram of a semiconductor device in accordance with various embodiments of the present disclosure.

FIG. 4 is an exemplary layout diagram of a semiconductor device 100 in accordance with various embodiments of the present disclosure. With respect to the embodiments of FIG. 1, FIG. 2 and FIG. 3, like elements in FIG. 4 are designated with the same reference numbers for ease of understanding. As illustratively shown in FIG. 4, some integrated circuit cells are disposed on the cell rows ROW1~ROW9 of the semiconductor device 100. There can be different types of integrated circuit cells, such as CELLa, CELLb, CELLc, CELLd and/or CELLe, in the semiconductor device 100 according to the exemplary layout shown in FIG. 4. The integrated circuit cells CELLa, CELLb, CELLc, CELLd and CELLe can be different standard cells with particular circuit functions (e.g., switch, amplifier, filter, adder, multiplexer, and-logic gate, or-logic gate, inverter, or current mirror) selected from standard cell libraries.

As discussed above, the cell rows ROW1, ROW2, ROW4, ROW5, ROW7 and ROW8 in the first group "A" with the higher row height RH1 correspond to a higher number of fin-shaped structures disposed along the Y-axis, and the cell row ROW3, ROW6 and ROW9 in the second group "B" with the shorter row height RH2 correspond to a lower number of fin-shaped structures disposed along the Y-axis. Further, in some embodiments, some integrated circuit cells disposed on the cell rows in the first group "A" with the higher number of fin-shaped structures may present a higher performance (e.g., a faster speed or a higher frequency) over some other integrated circuit cells disposed on the cell rows in the second group "B" with the lower number of fin-shaped structures. On the other hand, the integrated circuit cells disposed on the cell rows in the second group "B" with the lower number of fin-shaped structures may occupy a smaller area and typically present lower power consumption than the integrated circuit cells disposed on the cell rows in the first group "A".

As illustratively shown in FIG. 4, each of the integrated circuit cells CELLa is disposed on one cell row in the first group "A". In some embodiments, the integrated circuit cells CELLa can be standard cells to be implemented on 2-fins active regions. The integrated circuit cells CELLa is designed to have a high performance. Each of the integrated circuit cells CELLb are disposed on one cell row in the second group "B". In some embodiments, the integrated circuit cells CELLb can be standard cells to be implemented on 1-fin active regions. The integrated circuit cells CELLb is designed to have low power consumption. Each of the integrated circuit cells CELLc are disposed on one cell row in the first group "A" and also one cell row in the second group "B". In some embodiments, the integrated circuit cells CELLc can be standard cells to be implemented on hybrid-fin active regions (e.g., 2-fins plus 1-fin active regions) designed to have a balance configuration between performance and power consumption.

In addition, as illustratively shown in FIG. 4, the integrated circuit cell CELLd is disposed over two cell rows in the first group "A" and one cell row in the second group "B". The integrated circuit cell CELLe is disposed over one cell row in the first group "A", one cell row in the second group "B" and another one cell row in the first group "A".

In some applications of high-frequency integrated circuits (e.g., wireless communication circuits, oscillators, high-speed storage units, high-speed interfaces), a total amount of the integrated circuit cells CELLa and CELLc in the high-frequency integrated circuits will be much more than a total amount of the integrated circuit cells CELLb in the high-frequency integrated circuits.

The semiconductor device 100 as shown in FIG. 1 and FIG. 2 includes the cell rows in the first group "A" and the cell rows in the second group "B" interlaced in the periodic sequence "AAB" and the semiconductor device 100 includes more cell rows with the row height RH1 than cell rows with the row height RH2. The row quantity of cell rows in the first group A is greater than the row quantity of cell rows in the second group B. In the embodiments shown in FIG. 1-FIG. 4, a ratio between the row quantity in the first group A and the row quantity in the second group B in the periodic sequence is 2:1.

Compared to the existing techniques to form a circuit which only has one type of cell rows with the shorter row heights (e.g., only the low row heights), the semiconductor device 100 shown in FIG. 1 to FIG. 4 can achieve a higher performance (e.g., a faster speed or a higher frequency). Compared to the existing techniques to form a circuit which only has one type of cell rows with the higher row heights (e.g., only the high row heights), the semiconductor device 100 shown in FIG. 1 to FIG. 4 can achieve a better power consumption. Compared to the existing techniques to form a circuit which typically has equal quantities between cell rows with two different row heights (e.g., one high row height and one low row height alternatively), the semiconductor device 100 shown in FIG. 1 to FIG. 4 can achieve a relatively higher performance and also a relatively better power consumption, and also the semiconductor device 100 is suitable to be used in the applications of high-frequency integrated circuits (e.g., wireless communication circuits, oscillators, high-speed storage units, high-speed interfaces).

As illustratively shown in FIG. 1, FIG. 2 and FIG. 3, some power rails PR1~PR8 are disposed in the semiconductor device 100, and the power rails PR1~PR8 are disposed at boundaries between two adjacent cell rows ROW1~ROW9. The power rails PR1~PR8 are utilized to carry power signals (e.g., VDD, VSS, or VCC). As illustratively shown in FIG. 2 and FIG. 3, the power rail PR1 extends in the direction along the X-axis and the power rail PR1 is disposed at the boundary between the cell row ROW1 in the first group "A"

and the cell row ROW2 also in the first group "A". The power rail PR2 extends in the direction along the X-axis and the power rail PR2 is disposed at the boundary between the cell row ROW2 in the first group "A" and the cell row ROW3 in the second group "B". As illustratively shown in FIG. 3, in some embodiments, a rail width W1 of the power rail PR1 at a boundary between "A" and "A" is wider than a rail width of the power rail PR2 at a boundary between "A" and "B". In some embodiments, the power rail PR1 with the wider rail width W1 can provide a better isolation between the cell rows ROW1/ROW2 and a better power signal stability, compared to the power rail PR2. On the other hands, the power rail PR2 can be implemented with a smaller area on the layout, compared to the power rail PR1.

Similarly, as illustratively shown in FIG. 2, the power rails PR4 and PR7 disposed at boundaries between "A" and "A" may also have the wider rail width W1 similar to the power rail PR1. On the other hand, the power rails PR3, PR5, PR6 and PR8 disposed at boundaries between "A" and "B" may also have the shorter rail width W2 similar to the power rail PR2.

As illustratively shown in FIG. 1, in reference with the row height RH1 (i.e., the group "A") and the row height RH2 (the group "B"), the cell rows ROW1~ROW9 are interlaced according to the sequential order of "AABAABAAB". In other words, the cell rows ROW1~ROW9 are interlaced in the periodic sequence of "AAB". The disclosure is not limited to the embodiments shown in FIG. 1.

Figure 5:
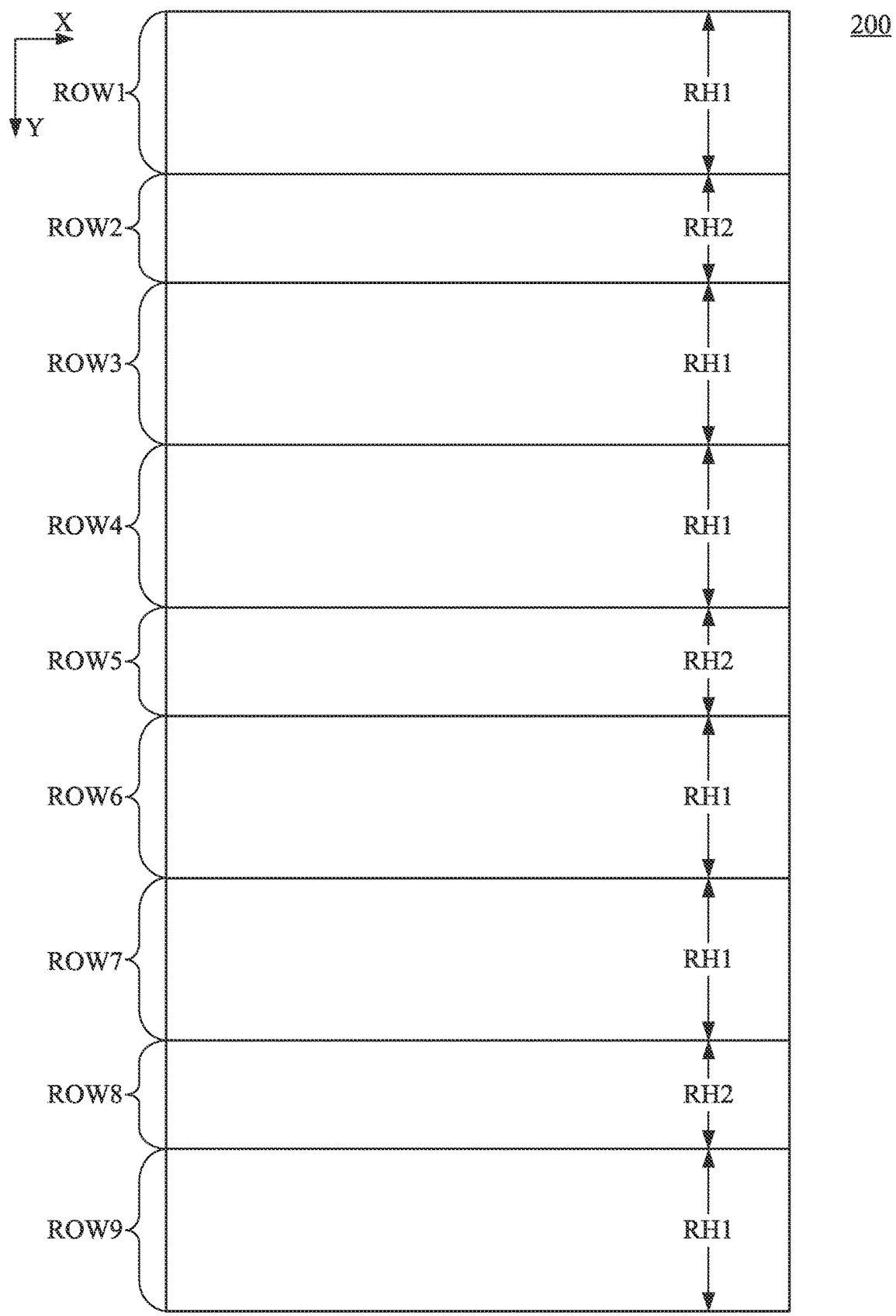
FIG. 5 is a top view diagram of a semiconductor device in accordance with various embodiments of the present disclosure.

FIG. 5 is a top view diagram of a semiconductor device in accordance with various embodiments of the present disclosure. As illustratively shown in FIG. 5, the semiconductor device 200 includes several cell rows ROW1~ROW9. In some embodiments, some integrated circuit cells (referring to FIG. 4) can be arranged on these cell rows ROW1~ROW9. The number of the cell rows ROW1~ROW9 in the semiconductor device 200 in FIG. 5 is given for illustrative purposes.

As illustratively shown in FIG. 5, the cell row ROW1 extends in a direction along an X axis. The cell row ROW2 is disposed adjacent to and parallel with the cell row ROW1, and the cell row ROW2 extends in the direction along the X axis. The cell row ROW3 is disposed adjacent to and parallel with the cell row ROW2, and the cell row ROW3 also extends in the direction along the X axis. Similarly, the cell rows ROW4~ROW9 are disposed in parallel with the cell rows ROW1, ROW2 and ROW3, and each of the cell rows ROW4~ROW9 extends in the direction along the X axis. As illustratively shown in FIG. 5, the cell rows ROW1~ROW9 are arranged along a Y axis, which is substantially perpendicular to the X axis.

In some embodiments, there are two groups of cell rows among the cell rows ROW1~ROW9 in reference with their row heights. As illustratively shown in FIG. 5, each of the cell rows ROW1, ROW3, ROW4, ROW6, ROW7 and ROW9 is configured to have a row height RH1, and each of the cell rows ROW2, ROW5 and ROW8 is configured to have another row height RH2, which is shorter than the row height RH1. As illustratively shown in FIG. 5, the cell rows ROW1, ROW3, ROW4, ROW6, ROW7 and ROW9 with the row height RH1 can be regarded as a first group "A" of the cell rows ROW1~ROW9, and the cell rows ROW2, ROW5 and ROW8 can be regarded as a second group "B" of the cell rows ROW1~ROW9.

In some embodiments, the cell rows in the first group "A" and the cell rows in the second group "B" are interlaced in a periodic sequence along the Y axis. As illustratively shown in FIG. 5, the cell rows ROW1~ROW9 are interlaced according to a sequential order of "ABAABAABA". In other words, the cell rows ROW1~ROW9 are interlaced in the periodic sequence of "ABA". As illustratively shown in FIG. 5, there are six cell rows ROW1, ROW3, ROW4, ROW6, ROW7 and ROW9 in the first group "A" and three cell rows ROW2, ROW5 and ROW8 in the second group "B". In other words, in the periodic sequence, a quantity of the cell rows in the first group "A" with the higher row height RH1 is greater than a quantity of the cell rows in the second group "B" with the shorter row height RH2.

Figure 6:
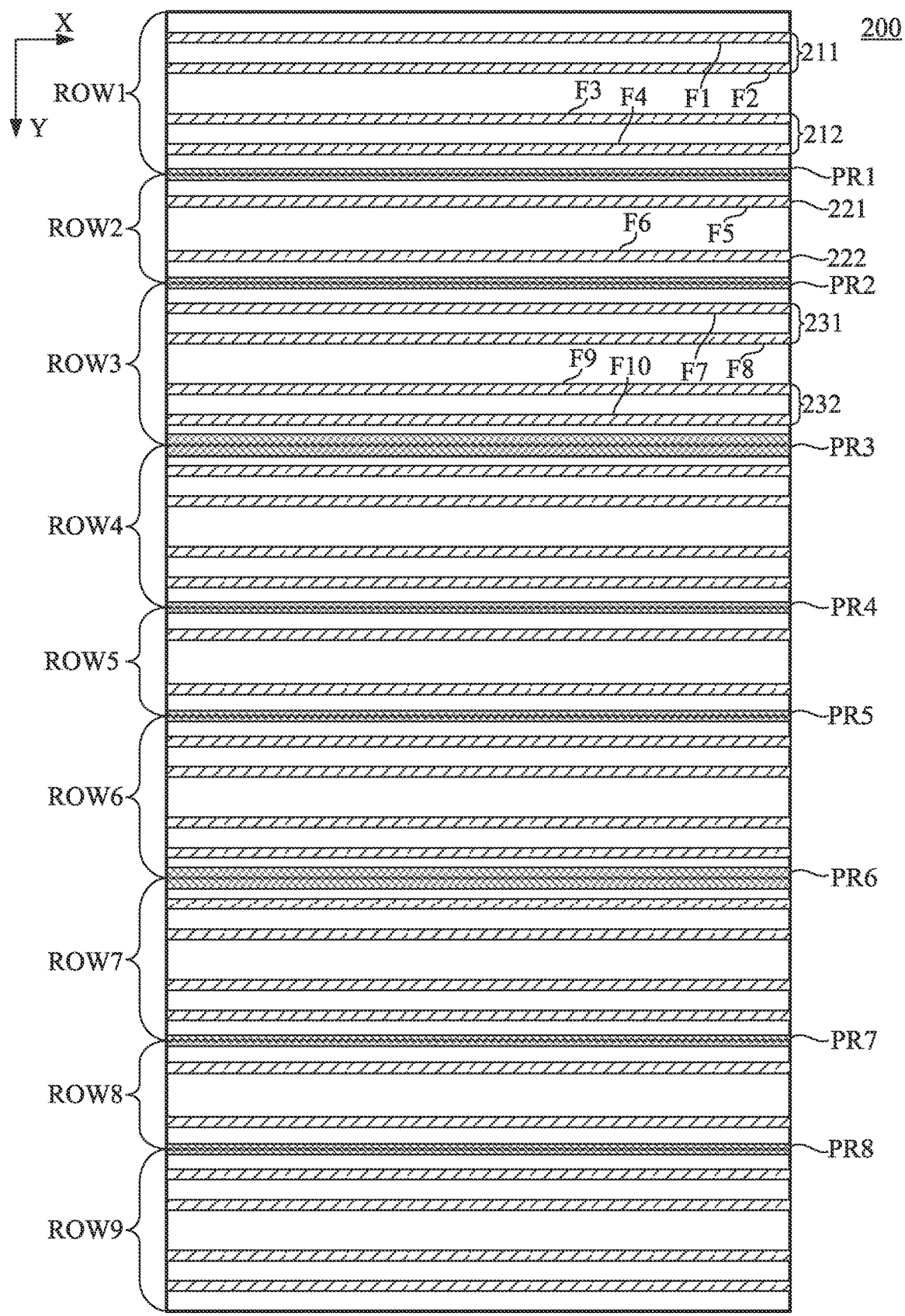
FIG. 6 is a top view diagram illustrating a structure of the semiconductor device in FIG. 5 in accordance with some embodiment.

FIG. 6 is a top view diagram illustrating a structure of the semiconductor device 200 in FIG. 5 in accordance with some embodiments. With respect to the embodiments of FIG. 5, like elements in FIG. 6 are designated with the same reference numbers for ease of understanding.

As illustratively shown in FIG. 5 and FIG. 6, the cell row ROW1 with the row height RH1 in the first group "A" includes two active regions 211 and 212. Each of the active regions 211 and 212 extend in the direction along the X axis. As illustrated in FIG. 6, the active region 211 of the cell row ROW1 includes two fin-shaped structures F1 and F2, and the active region 212 of the cell row ROW1 includes another two fin-shaped structures F3 and F4. In other words, each one of the active regions 211 and 212 include two fin-shaped structures, such as F1 and F2, or F3 and F4.

As illustratively shown in FIG. 5 and FIG. 6, the cell row ROW2 with the row height RH2 in the second group "B" includes two active regions 221 and 222. Each of the active regions 221 and 222 extend in the direction along the X axis. As illustrated in FIG. 5 and FIG. 6, the active region 221 of the cell row ROW2 includes one fin-shaped structure F5, and the active region 222 of the cell row ROW2 includes one fin-shaped structure F6. In other words, each one of the active regions 221 and 222 include one fin-shaped structure, such as F5, or F6.

As illustratively shown in FIG. 5 and FIG. 6, the cell row ROW3 with the row height RH1 in the first group "A" includes two active regions 231 and 232. Each of the active regions 231 and 232 extend in the direction along the X axis. As illustrated in FIG. 5 and FIG. 6, the active region 231 of the cell row ROW3 includes two fin-shaped structures F7 and F8, and the active region 232 of the cell row ROW3 includes another two fin-shaped structure F9 and F10. In other words, each one of the active regions 231 and 232 include two fin-shaped structures, such as F7 and F8, or F9 and F10.

As illustratively shown in FIG. 5 and FIG. 6, the cell rows ROW4~ROW6 have structures similar to the cell rows ROW1~ROW3, and the cell rows ROW7~ROW9 also have structures similar to the cell rows ROW1~ROW3. For brevity, details of the cell rows ROW4~ROW9 are not repeated here again.

As illustratively shown in FIG. 5, the cell rows ROW1~ROW9 are interlaced according to a sequential order of "ABAABAABA", compared to the cell rows ROW1~ROW9 in FIG. 1 are interlaced according to another sequential order of "AABAABAAB".

The semiconductor device 200 as shown in FIG. 5 and FIG. 6 includes the cell rows in the first group "A" and the cell rows in the second group "B" interlaced in the periodic sequence "ABA" and the semiconductor device 200 includes more cell rows with the row height RH1 than cell rows with the row height RH2. In the embodiments shown in FIG. 5-FIG. 6, a ratio between the row quantity in the first group A and the row quantity in the second group B in the periodic sequence is 2:1.

Compared to the existing techniques to form a circuit which only has one type of cell rows with the shorter row heights (e.g., only the low row heights), the semiconductor device 200 shown in FIG. 5 to FIG. 6 can achieve a higher performance (e.g., a faster speed or a higher frequency). Compared to the existing techniques to form a circuit which only has one type of cell rows with the higher row heights (e.g., only the high row heights), the semiconductor device 200 shown in FIG. 5 to FIG. 6 can achieve a better power consumption. Compared to the existing techniques to form a circuit which typically has equal quantities between cell rows with two different row heights (e.g., one high row height and one low row height alternatively), the semiconductor device 200 shown in FIG. 5 to FIG. 6 can achieve a relatively higher performance and also a relatively better power consumption, and also the semiconductor device 200 is suitable to be used in the applications of high-frequency integrated circuits (e.g., wireless communication circuits, oscillators, high-speed storage units, high-speed interfaces).

As illustratively shown in FIG. 6, some power rails PR1~PR8 are disposed in the semiconductor device 200, and the power rails PR1~PR8 are disposed at boundaries between two adjacent cell rows ROW1~ROW9. The power rails PR1~PR8 are utilized to carry power signals (e.g., VDD, VSS, or VCC). As illustratively shown in FIG. 6, the power rail PR1 extends in the direction along the X-axis and the power rail PR1 is disposed at the boundary between the cell row ROW1 in the first group "A" and the cell row ROW2 in the second group "B". The power rail PR2 extends in the direction along the X-axis and the power rail PR2 is disposed at the boundary between the cell row ROW2 in the second group "B" and the cell row ROW3 in the first group "A". The power rail PR3 extends in the direction along the X-axis and the power rail PR3 is disposed at the boundary between the cell row ROW3 in the first group "A" and the cell row ROW4 in the first group "A".

As illustratively shown in FIG. 6, in some embodiments, a rail width of the power rail PR3 at a boundary between "A" and "A" is wider than a rail width of the power rail PR1 at a boundary between "A" and "B" or a rail width of the power rail PR2 at a boundary between "B" and "A". In some embodiments, the power rail PR3 with the wider rail width can provide a better isolation between the cell rows ROW3/ROW4 and a better power signal stability, compared to the power rail PR1 or PR2. On the other hands, the power rail PR1 or PR2 can be implemented with a smaller area on the layout, compared to the power rail PR3.

As discussed above, in embodiments shown in FIG. 1-FIG. 4 and FIG. 5-FIG. 6, the ratio between the row quantity in the first group A and the row quantity in the second group B in the periodic sequence is 2:1. The disclosure is not limited to this ratio.

In some other embodiments, a ratio between a row quantity of the cell rows with the row height RH1 (i.e., the first group "A") and a row quantity of the cell rows with the row height RH2 (i.e., the second group "B") in the periodic sequence can be M:N. M and N are positive integers and M>N.

Figure 7:
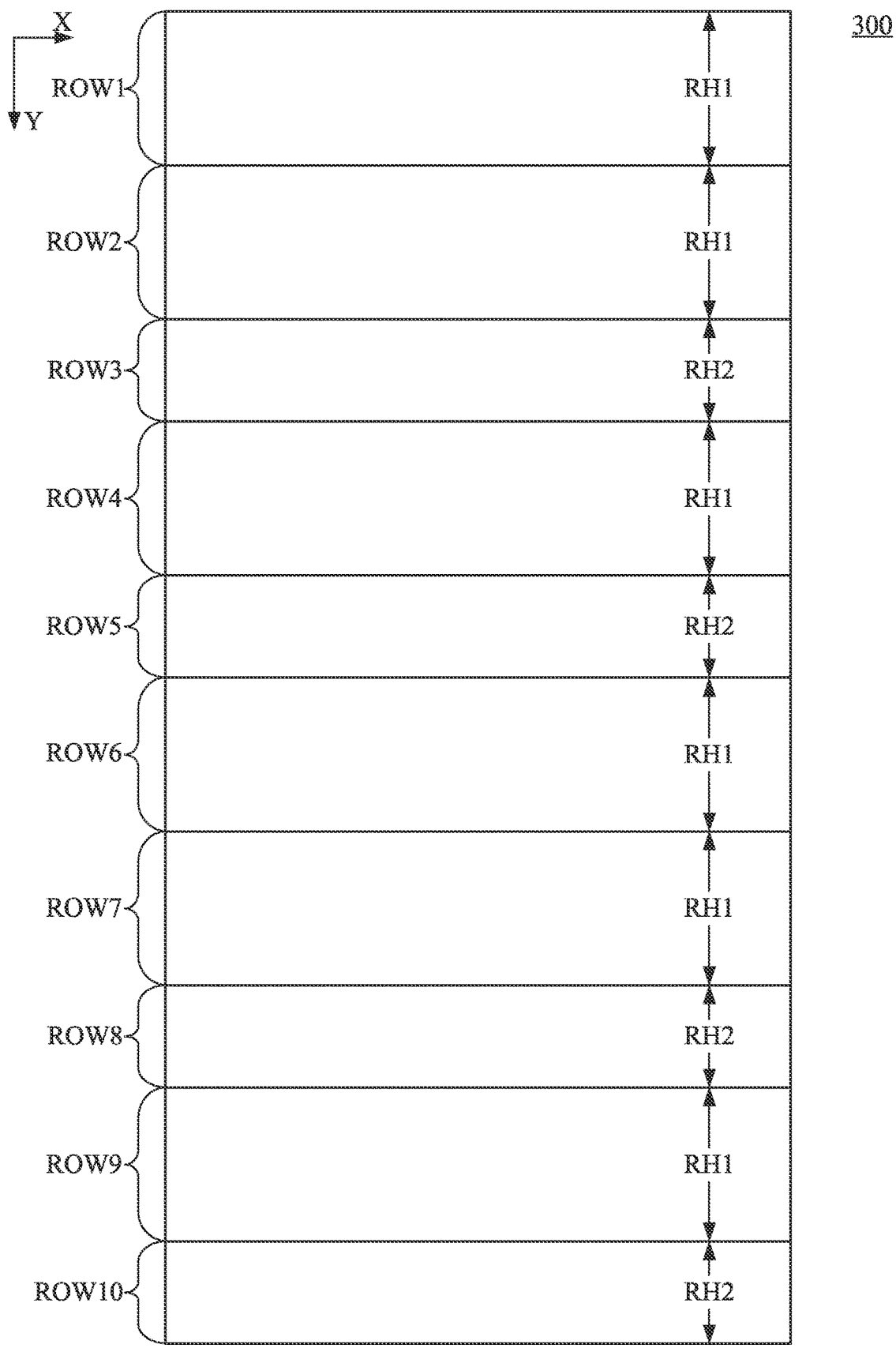
FIG. 7 is a top view diagram of a semiconductor device in accordance with various embodiments of the present disclosure.

FIG. 7 is a top view diagram of a semiconductor device in accordance with various embodiments of the present disclosure. As illustratively shown in FIG. 7, the semiconductor device 300 includes several cell rows ROW1~ROW10. In some embodiments, some integrated circuit cells (referring to FIG. 4) can be arranged on these cell rows ROW1~ROW10. The number of the cell rows ROW1~ROW10 in the semiconductor device 300 in FIG. 7 is given for illustrative purposes.

In some embodiments, there are two groups of cell rows among the cell rows ROW1~ROW10 in reference with their row heights. As illustratively shown in FIG. 7, each of the cell rows ROW1, ROW2, ROW4, ROW6, ROW7 and ROW9 is configured to have a row height RH1, and each of the cell rows ROW3, ROW5, ROW8 and ROW10 is configured to have another row height RH2, which is shorter than the row height RH1. As illustratively shown in FIG. 7, the cell rows ROW1, ROW2, ROW4, ROW6, ROW7 and ROW9 with the row height RH1 can be regarded as a first group "A" of the cell rows ROW1~ROW10, and the cell rows ROW3, ROW5, ROW8 and ROW10 can be regarded as a second group "B" of the cell rows ROW1~ROW10.

In some embodiments, the cell rows in the first group "A" and the cell rows in the second group "B" are interlaced in a periodic sequence along the Y axis. As illustratively shown in FIG. 7, the cell rows ROW1~ROW10 are interlaced according to a sequential order of "AABABAABAB". In other words, the cell rows ROW1~ROW10 are interlaced in the periodic sequence of "AABAB". As illustratively shown in FIG. 7, there are six cell rows ROW1, ROW2, ROW4, ROW6, ROW7 and ROW9 in the first group "A" and four cell rows ROW3, ROW5, ROW8 and ROW10 in the second group "B". In other words, in the periodic sequence "AABAB", a quantity of the cell rows in the first group "A" with the higher row height RH1 is greater than a quantity of the cell rows in the second group "B" with the shorter row height RH2.

Compared to the existing techniques to form a circuit which only has one type of cell rows with the shorter row heights (e.g., only the low row heights), the semiconductor device 300 shown in FIG. 7 can achieve a higher performance (e.g., a faster speed or a higher frequency). Compared to the existing techniques to form a circuit which only has one type of cell rows with the higher row heights (e.g., only the high row heights), the semiconductor device 300 shown in FIG. 7 can achieve a better power consumption. Compared to the existing techniques to form a circuit which typically has equal quantities between cell rows with two different row heights (e.g., one high row height and one low row height alternatively), the semiconductor device 300 shown in FIG. 7 can achieve a relatively higher performance and also a relatively better power consumption, and also the semiconductor device 300 is suitable to be used in the applications of high-frequency integrated circuits (e.g., wireless communication circuits, oscillators, high-speed storage units, high-speed interfaces).

Based on aforesaid embodiments, the semiconductor device can include cell rows with different row heights, such as the row heights RH1 and RH2. In some embodiments, the ratio between a row quantity of the cell rows with the row height RH1 (i.e., the first group "A") and a row quantity of the cell rows with the row height RH2 (i.e., the second group "B") in the periodic sequence can be 2:1, 3:1, 4:1, 5:1, 3:2, 4:3, 5:2, 5:3, 5:4, or any equivalent combination, which has more cell rows with the row height RH1 than the cell rows with the row height RH2.

Figure 8:
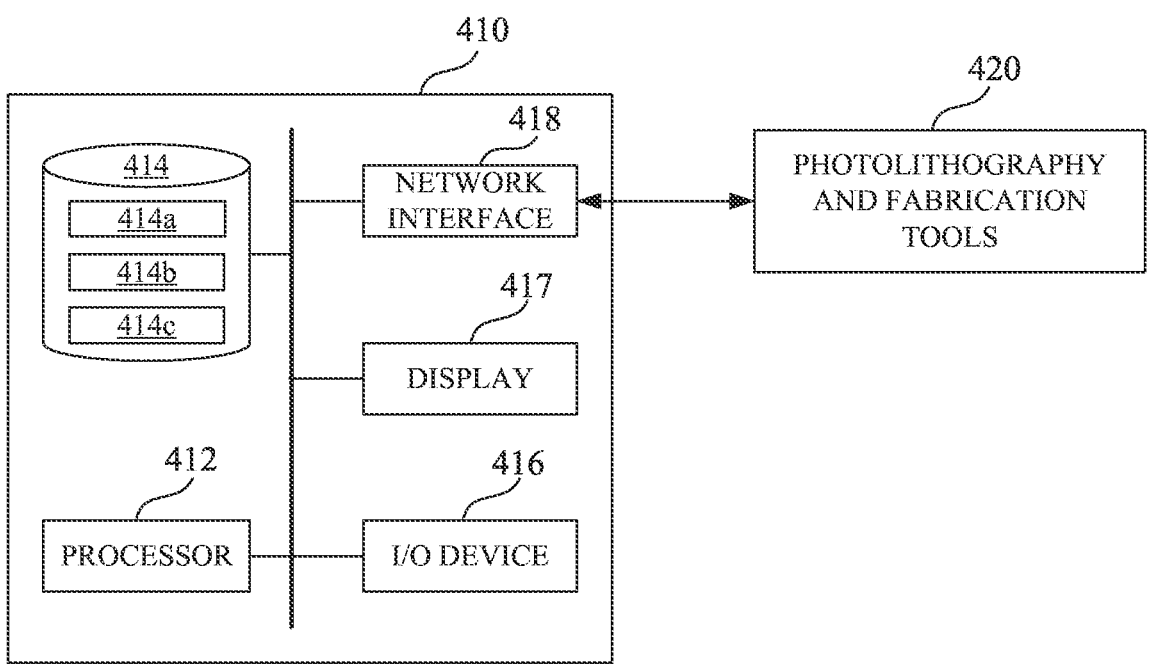
FIG. 8 is a functional block diagram of a system for designing, forming and/or fabricating a layout design in accordance with some embodiments.

FIG. 8 is a functional block diagram of a system 400 for designing, forming and/or fabricating a layout design in accordance with some embodiments. The system 400 is usable for designing, forming or fabricating the semiconductor devices 100, 200 or 300 disclosed in FIG. 1 to FIG. 7.

The system 400 includes a computer system 410 and a photolithography and fabrication tools 420. The computer system 410 includes a hardware processor 412 communicatively coupled with a non-transitory computer readable storage medium 414 encoded with, i.e., storing, a set of instructions 414*a*, a layout design 414*b*, and any intermediate data 414*c* for executing the set of instructions 414*a*. The processor 412 is electrically and communicatively coupled with the computer readable storage medium 414. The processor 412 is configured to execute the set of instructions 414*a* encoded in the computer readable storage medium 414 in order to cause the computer system 410 to be usable as a layout designing tool for designing the semiconductor devices 100, 200 or 300 disclosed in FIG. 1 to FIG. 7.

In some embodiments, the set of instructions 414*a*, the layout design 414*b*, and/or the intermediate data 414*c* are stored in a non-transitory storage medium other than storage medium 414. In some embodiments, some or all of the set of instructions 414*a*, the layout design 414*b*, or the intermediate data 414*c* are stored in a non-transitory storage medium in networked storage device (not shown in figures). In such case, some or all of the set of instructions 414*a*, the layout design 414*b*, or the intermediate data 414*c* stored outside computer system 410 is accessible by the processor 412 through a network.

In some embodiments, the processor 412 is a central processing unit (CPU), a multi-processor, a distributed processing system, an application specific integrated circuit (ASIC), and/or a suitable processing unit.

In some embodiments, the computer readable storage medium 414 is an electronic, magnetic, optical, electromagnetic, infrared, and/or a semiconductor system (or apparatus or device). For example, the computer readable storage medium 414 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 414 includes a compact disk-read only memory (CD-ROM), a compact disk-read/write (CD-R/W), and/or a digital video disc (DVD).

The computer system 410 includes, in at least some embodiments, an input/output device 416, a display 417 and a network interface 418. The input/output device 416 is coupled to the processor 412 and allows the circuit designer to manipulate the computer system 410. In at least some embodiments, the display 417 displays the status of executing the set of instructions 414*a* and, in at least some embodiments, provides a Graphical User Interface (GUI). In at least some embodiments, the input/output device 416 and the display 417 allow an operator to operate the computer system 410 in an interactive manner. The network interface 418 allows the computer system 410 to communicate with the photolithography and fabrication tools 420, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In some embodiments, an integrated circuit design layout that is completed using the system 400 in accordance with one or more of the processes described above with reference to FIG. 1 to FIG. 7 may be transferred to one or more photolithography and fabrication tools 420 to generate a photomask and fabricate an integrated circuit.

Figure 9:
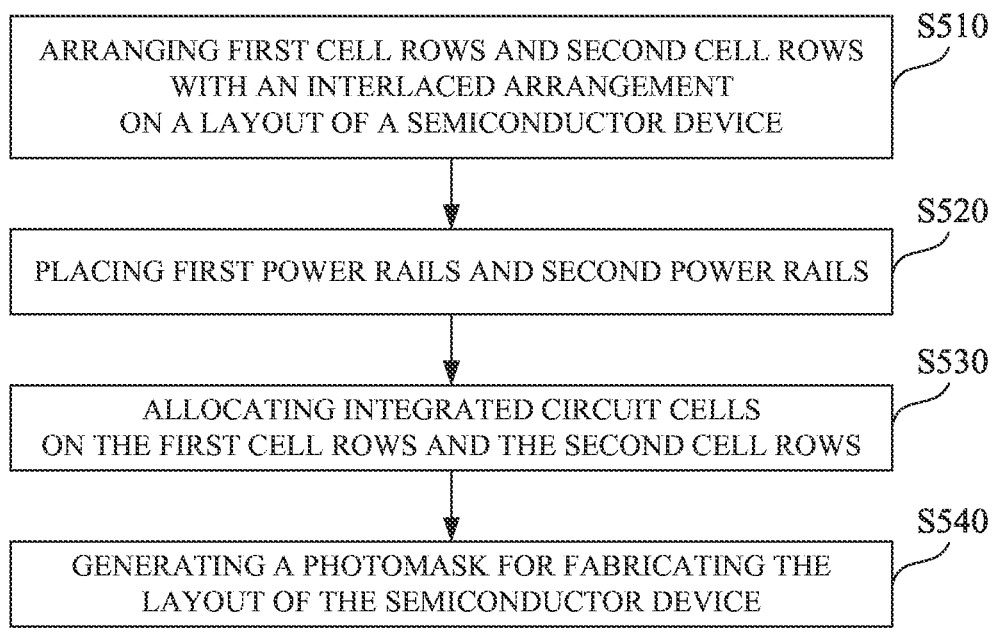
FIG. 9 is a flow chart diagram illustrating a method for designing, forming and/or fabricating a layout of a semiconductor device in accordance with some embodiments.

FIG. 9 is a flow chart diagram illustrating a method 500 for designing, forming and/or fabricating a layout of a semiconductor device in accordance with some embodiments. The method 500 is usable for designing, forming or fabricating the semiconductor devices 100, 200 or 300 disclosed in FIG. 1 to FIG. 7.

As illustratively shown in FIG. 9, operation S510 is performed to arrange first cell rows (i.e., the cell rows with the higher row height RH1 in the first group "A" shown in FIG. 1, FIG. 5 or FIG. 7 discussed in aforementioned embodiments) and second cell rows (i.e., the cell rows with the shorter row height RH2 in the second group "B" shown in FIG. 1, FIG. 5 or FIG. 7 discussed in aforementioned embodiments) with an interlaced arrangement on a layout of a semiconductor device (i.e., the semiconductor device 100/200/300 shown in FIG. 1, FIG. 5 or FIG. 7) according to a periodic sequence. As illustratively shown in FIG. 1, FIG. 5 or FIG. 7, each of the first cell rows has a first row height RH1 higher than a second row height RH2 of each of the second cell rows. In addition, a quantity of the first cell rows in the periodic sequence is greater than a quantity of the second cell rows in the periodic sequence.

As illustratively shown in FIG. 9, operation S520 is performed to place first power rails (i.e., the power rails with the wider rail width W1 shown in FIG. 3 discussed in aforementioned embodiments) and second power rails (i.e., the power rails with the shorter rail width W2 shown in FIG. 3 discussed in aforementioned embodiments). As shown in FIG. 2, FIG. 3 and FIG. 6 discussed in aforementioned embodiments, each of the first power rails is placed at a boundary between two of the first cell rows. As shown in FIG. 2, FIG. 3 and FIG. 6 discussed in aforementioned embodiments, each of the second power rails is placed at a boundary between one of the first cell rows and one of the second cell rows. A first rail width W1 of each of the first power rails is wider than a second rail width W2 of each of the second power rails as shown in FIG. 3.

As illustratively shown in FIG. 9, operation S530 is performed to allocate integrated circuit cells (i.e., CELLa, CELLb, CELLc, CELLd and/or CELLe shown in FIG. 4) on the first cell rows and the second cell rows. As illustratively shown in FIG. 9, operation S540 is performed to generate a photomask for fabricating the layout of the semiconductor device 100, 200 or 300 disclosed in FIG. 1 to FIG. 7.

In some embodiments, a method includes disposing a first power rail, a second power rail and a third power rail arranged in order; disposing a first cell row having a first row height between the first power rail and the second power rail; and disposing a second cell row having the first row height between the third power rail and the second power rail. In some embodiments, each of the first power rail and the third power rail has a first width, and the second power rail has a second width larger than the first width.

In some embodiments, a method includes disposing a first integrated circuit cell in a first cell row and a second cell row; disposing a second integrated circuit cell in a third cell row and a fourth cell row; and disposing a third integrated circuit cell in a fifth cell row. In some embodiments, the first cell row, the second cell row, the fifth cell row, the third cell row and the fourth cell row and are arranged in order, and a first row height of each of the first cell row, the fifth cell row and the third cell row is larger than a second row height of each of the second cell row and the fourth cell row.

In some embodiments, a method includes arranging first cell rows and second cell rows with an interlaced arrangement on a layout of a semiconductor device according to a periodic sequence. Each of the first cell rows has a first row height higher than a second row height of each of the second cell rows. A first row quantity of the first cell rows in the periodic sequence is greater than a second row quantity of the second cell rows in the periodic sequence. In some embodiments, the first cell rows includes a first cell row, a second cell row and a third cell row, the second cell rows includes a fourth cell row and a fifth cell row, and the first cell row, the second cell row, the fourth cell row, the third cell row and the fifth cell row are arranged in order.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    disposing a first power rail, a second power rail and a third power rail arranged in order;
    disposing a first cell row having a first row height between the first power rail and the second power rail;
    disposing a second cell row having the first row height between the third power rail and the second power rail; and
    disposing a plurality of first fin-shaped structures in the first cell row,
    wherein each of the first power rail and the third power rail has a first width,
    the second power rail has a second width larger than the first width,
    a number of fin-shaped structures between the first power rail and the second power rail is equal to four,
    a first part of the plurality of first fin-shaped structures has a first conductive type, and
    a second part of the plurality of first fin-shaped structures has a second conductive type different from the first conductive type.

2. The method of claim 1, further comprising:
    disposing a fourth power rail; and
    disposing a third cell row having a second row height between the third power rail and the fourth power rail,
    wherein the second power rail, the third power rail and the fourth power rail are arranged in order, and
    the second row height is smaller than the first row height.

3. The method of claim 2, further comprising:
    disposing a first integrated circuit cell between the second power rail and the fourth power rail,
    wherein a height of the first integrated circuit cell is approximately equal to the second row height plus the first row height.

4. The method of claim 3, further comprising:
    disposing a fifth power rail; and
    disposing a fourth cell row having the first row height between the fourth power rail and the fifth power rail,
    wherein the third power rail, the fourth power rail and the fifth power rail are arranged in order.

5. The method of claim 4, further comprising:
    disposing a second integrated circuit cell between the second power rail and the fifth power rail,
    wherein a height of the second integrated circuit cell is approximately equal to the second row height plus twice of the first row height.

6. The method of claim 3, further comprising:
    disposing a fifth power rail having the first width;
    disposing a fourth cell row having the second row height between the first power rail and the fifth power rail;
    disposing a sixth power rail having the second width; and
    disposing a fifth cell row having the first row height between the sixth power rail and the fifth power rail,
    wherein the sixth power rail, the fifth power rail and the first power rail are arranged in order.

7. The method of claim 6, further comprising:
    disposing a second integrated circuit cell between the first power rail and the sixth power rail,
    wherein a first number of fin-shaped structures corresponding to the first integrated circuit cell is same as a second number of fin-shaped structures corresponding to the second integrated circuit cell.

8. The method of claim 7, further comprising:
    disposing a third integrated circuit cell between the first integrated circuit cell and the second integrated circuit cell,
    wherein a third number of fin-shaped structures corresponding to the third integrated circuit cell is smaller than the second number.

9. A method, comprising:
    disposing a first power rail, a second power rail, a third power rail and a fourth power rail arranged in order;
    disposing a first cell row having a first row height between the first power rail and the second power rail;
    disposing a second cell row having the first row height between the third power rail and the second power rail;
    disposing a plurality of first fin-shaped structures in the first cell row;
    disposing a plurality of second fin-shaped structures in the second cell row;
    disposing a third cell row between the third power rail and the fourth power rail;
    disposing a plurality of third fin-shaped structures in the third cell row;
    disposing a fourth cell row adjacent to the first power rail; and
    disposing a fourth fin-shaped structure and a fifth fin-shaped structure in the fourth cell row,
    wherein each of the first power rail and the third power rail has a first width,
    the second power rail has a second width larger than the first width,
    a number of the plurality of first fin-shaped structures is same as a number of the plurality of second fin-shaped structures,
    the number of the plurality of first fin-shaped structures is twice a number of the plurality of third fin-shaped structures,
    the fourth fin-shaped structure has a first conductive type, and
    the fifth fin-shaped structure has a second conductive type different from the first conductive type.

10. The method of claim 9, wherein
    the third cell row has a second row height between the third power rail and the fourth power rail, and
    the second row height is smaller than the first row height.

11. The method of claim 10, wherein the fourth power rail has the first width.

12. The method of claim 10, further comprising:
    disposing a fifth power rail; and
    disposing a fifth cell row having the first row height between the fifth power rail and the fourth power rail,
    wherein the third power rail, the fourth power rail and the fifth power rail are arranged in order.

13. The method of claim 12, further comprising:
    disposing a plurality of sixth fin-shaped structures in the fifth cell row, wherein the number of the plurality of first fin-shaped structures is same as a number of the plurality of sixth fin-shaped structures.

14. The method of claim 9, wherein the first conductive type is n-type, and the second conductive type is p-type.

15. A method, comprising:
disposing a first power rail, a second power rail and a third power rail arranged in order;
disposing a first cell row having a first row height between the first power rail and the second power rail;
disposing a second cell row having a second row height between the third power rail and the second power rail; and
disposing a plurality of first fin-shaped structures in the first cell row,
wherein each of the second power rail and the third power rail has a first width,
the first power rail has a second width larger than the first width,
a first part of the plurality of first fin-shaped structures has a first conductive type, and
a second part of the plurality of first fin-shaped structures has a second conductive type different from the first conductive type.

16. The method of claim 15, wherein each of the plurality of first fin-shaped structures is separated from the first power rail in a layout view.

17. The method of claim 16, further comprising:
disposing a plurality of second fin-shaped structures,
wherein the first power rail is disposed between the plurality of second fin-shaped structures and the plurality of first fin-shaped structures.

18. The method of claim 17, wherein
a third part of the plurality of second fin-shaped structures has the first conductive type, and
a fourth part of the plurality of second fin-shaped structures has the second conductive type.

19. The method of claim 18, wherein the first part, the second part, the third part and the fourth part are arranged in order.

20. The method of claim 16, further comprising:
disposing a plurality of second fin-shaped structures,
wherein the second power rail is disposed between the plurality of second fin-shaped structures and the plurality of first fin-shaped structures, and
a number of the plurality of first fin-shaped structures is twice a number of the plurality of second fin-shaped structures.

* * * * *